United States Patent [19]

Nishimura

[11] Patent Number: 5,136,347
[45] Date of Patent: Aug. 4, 1992

[54] SEMICONDUCTOR STRUCTURE

[75] Inventor: Takashi Nishimura, Itami, Japan

[73] Assignee: Mitsubishi Denki Kabushiki Kaisha, Japan

[21] Appl. No.: 606,825

[22] Filed: Oct. 31, 1990

[30] Foreign Application Priority Data

Mar. 30, 1990 [JP] Japan .................................. 2-86715

[51] Int. Cl.$^5$ .................. H01L 29/161; H01L 21/203
[52] U.S. Cl. .......................................... 357/16; 357/4; 357/61; 437/105; 437/107; 437/84
[58] Field of Search ............... 357/16, 4, 61; 437/105, 437/107, 84

[56] References Cited

U.S. PATENT DOCUMENTS

| 4,845,044 | 7/1989 | Ariyoshi et al. | 357/16 |
| 4,862,228 | 8/1989 | Ralph | 357/16 |

FOREIGN PATENT DOCUMENTS 0177903 4/1986 European Pat. Off. .
0365875 5/1990 European Pat. Off. .
2-167895 6/1990 Japan .

OTHER PUBLICATIONS

Fisher et al, "Material Properties of High-Quality GaAs Epitaxial Layers Grown On Si Substrates", Journal of Applied Physics, vol. 60, No. 5, Sep. 1986, pp. 1640–1647.

Ueda et al, "Effect of the Substrate . . . Si Substrate", Japanese Journal of Applied Physics, vol. 25, No. 9, Sep. 1986, pp. L789–L791.

Primary Examiner—Edward J. Wojciechowicz
Attorney, Agent, or Firm—Leydig, Voit & Mayer

[57] ABSTRACT

A semiconductor structure includes a single crystal silicon body, a relatively thin single crystal aluminum arsenide layer disposed on the silicon body, a relatively thin single crystal gallium arsenide layer disposed on the aluminum arsenide layer, and a relatively thick single crystal compound semiconductor layer disposed on the gallium arsenide layer.

11 Claims, 5 Drawing Sheets

SEMICONDUCTOR STRUCTURE

FIELD OF THE INVENTION

The present invention relates to a semiconductor structure and, more particularly, to a semiconductor structure formed on a Si substrate or a Si layer.

BACKGROUND OF THE ART

Figure 4A:
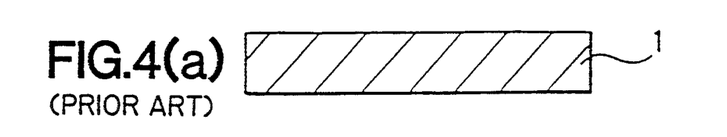
Figure 4B:
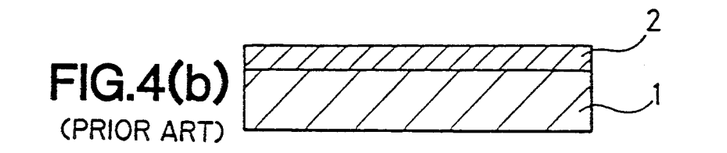
Figure 4C:
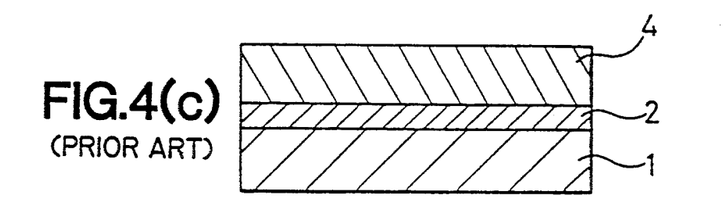

FIGS. 4(a)–4(c) are sectional views showing main steps for forming a GaAs (gallium arsenide) layer on a Si substrate, which is disclosed in, for example Japanese Journal of Applied Physics Vol. 25 Sep., 1986, L789–L791 "Effects of the Substrate Offset Angle on the Growth of GaAs on Si substrate".

In those figures, reference numeral 1 designates a Si substrate having surface orientation which is off angle by several degrees from a (100) surface toward the <011> direction, reference numeral 2 designates a GaAs layer grown at low temperature (400° C.), reference numeral 4 designates a GaAs layer grown at high temperature (700° C.).

Next, a method for manufacturing those will be described in detail.

First, a surface of the Si substrate 1 is cleaned in a hydrogen ($H_2$) atmosphere at 900° C. or more (FIG. 4(a)). Then, the Si substrate 1 is cooled and a GaAs layer is grown thereon at approximately 400° C. by the MOCVD method to a thickness of 100Å (FIG. 4(b)). Thereafter, the Si substrate 1 is heated up at 700° C. and then the GaAs layer 4 is grown to a thickness of 2 microns by the MOCVD method on the GaAs layer 2 which has been grown at low temperature (FIG. 4(c)).

However, in a case where a crystal is grown on different kinds of substrates, typical of a case where the GaAs layer is formed on the Si substrate, three-dimensional growth of GaAs is likely to occur because stress is generated by the difference in lattice constant of Si and GaAs or surface orientation growth rate dependency. If the GaAs layer is grown at low temperature (~400° C.), crystal quality is low but it is possible to prevent generation of three-dimensional crystal which is likely to occur because of the surface orientation dependency of the crystal growth or rate or stress generated by a difference in the lattice constants. More specifically, at low temperature, when a crystal is grown under the condition of chemical non-equilibrium, surface orientation dependency or three- dimensional crystal growth is not likely to occur, so that the plane two-dimensional GaAs crystal 2 can be easily obtained. Therefore, it is possible to form a GaAs layer 4 of high quality having good coverage by forming the thin GaAs layer 2 at low temperature first to flatten the surface of the Si substrate and then forming the GaAs layer at high temperature.

Figure 5:
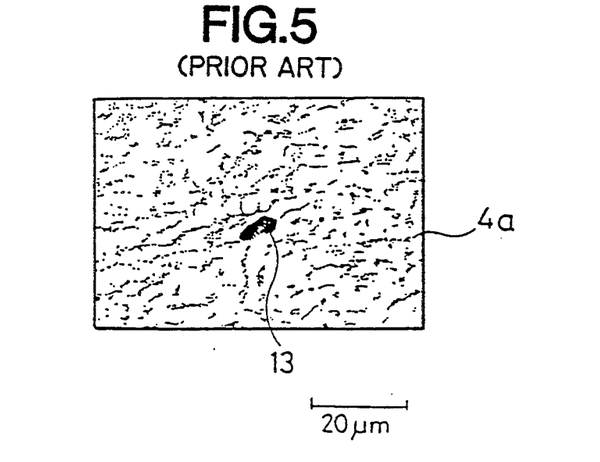
FIG. 5 is a view from a photograph showing a surface of a GaAs crystal formed on an Si crystal according to the prior art.

As described above, in the conventional method for growing the GaAs layer on the Si substrate, means for forming the plane GaAs layer 4 on the Si substrate is provided. However, abnormal growth of GaAs is not effectively prevented as shown in FIG. 5, taken from a photograph), in which there is abnormal growth of GaAs on the (100) surface of the GaAs crystal. In FIG. 5, reference numeral 4a designates a (100) surface of the GaAs layer 4 and reference numeral 13 designates a pit around which there is abnormal growth of GaAs.

Figure 6A:
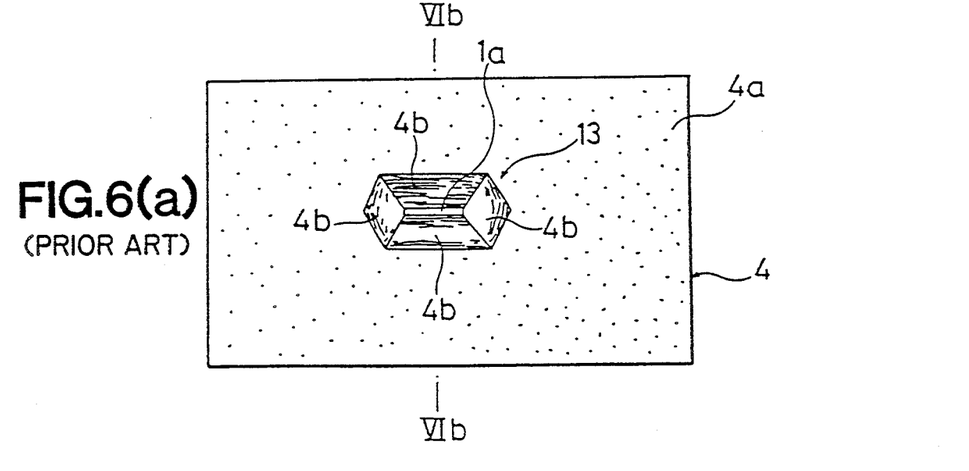
FIGS. 6(a)–6(c) are views used in describing problems in the prior art.
Figure 6B:
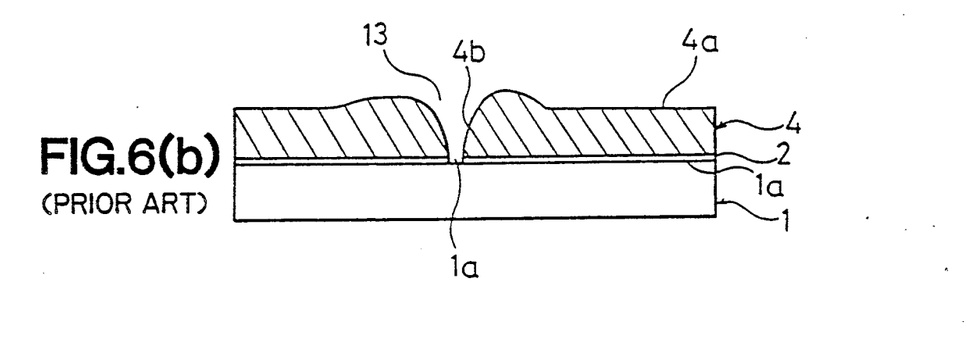
Figure 6C:
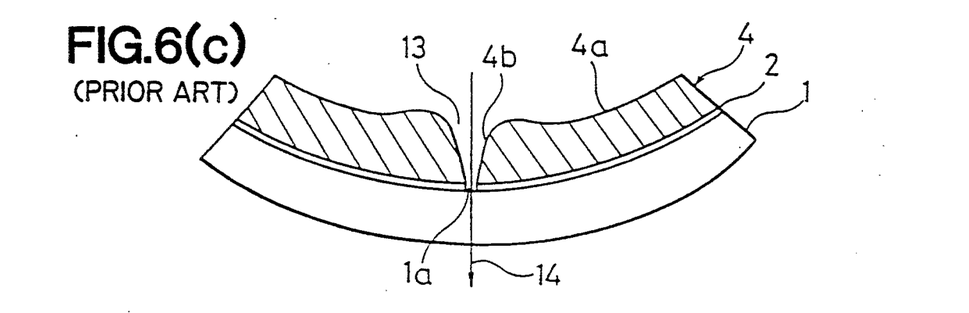

Thus, when there is dust or other defects (pit) on the Si substrate 1, GaAs is abnormally grown. FIG. 6(a) is a plan view showing abnormal growth of GaAs around a defect of the Si substrate surface just after GaAs is sequentially grown at low and high temperature on the Si substrate 1 and FIG. 6(b) is a sectional view taken along a line VIb–VIb of FIGS. 6(a)–6(c). In FIG. 6, the same references as in FIG. 4 designate the same parts. Reference numeral 4a designates a (100) surface of the GaAs layer 4 grown at high temperature, reference numeral 4b designates a (111) surface of the GaAs layer 4 grown at high temperature, reference numeral 13 designates a pit and reference numeral 1a designates an exposed Si (100) surface. As shown in FIGS. 6(a)–6(c), the GaAs layer 4a of is grown on the Si substrate which is off angle by of several degrees from the (100) surface towards the <011> direction. However, if there is a defect on the Si surface, GaAs is not likely to be grown at that defect and the GaAs (111) surface 4b is actively grown around that defect, with the result that a trench 13 surrounded by the abnormally grown GaAs (111) surface is formed.

In addition, when the GaAs layer is formed on the Si substrate, since my thermal expansion coefficient of GaAs is more than twice that of Si (Si ; $2.4 \times 10^{-6}[K^{-1}]$, GaAs ; $5.7 \times 10^{-6}[K^{-1}]$), thermal stress of approximately $1 \times 10^9 \sim 2 \times 10^9$ dyn cm$^{-2}$ remains in the GaAs layer, causing the substrate to be curved. In addition, the intensity of this stress is very close to the rupture strength of the GaAs layer 4 and when this thermal stress converges around the abnormal growth of GaAs, a crack is likely to be generated in the GaAs layer. As a result, performance or yield of the semiconductor device is considerably lowered. FIG. 6(c) shows a curved substrate, in which the crack 14 is generated in the pit 13 because of the difference between the thermal expansion coefficients of Si and GaAs. At this time, the temperature has dropped from that in FIG. 6(b). Therefore, it is necessary to limit the thickness of the GaAs layer 4 to 3.0 microns or less to prevent the remaining thermal stress in the GaAs layer from converging at the pit 13 on the GaAs substrate surface and a crack from being generated.

Figure 7A:
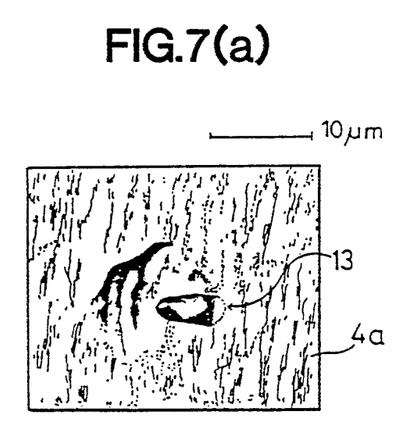
Figure 7B:
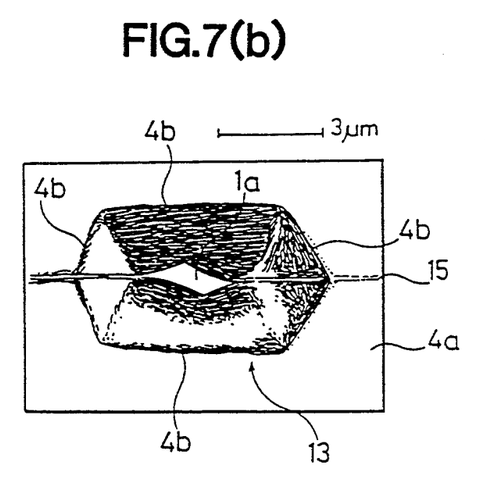

FIGS. 7(a) and 7(b) show the abnormal growth of GaAs around the surface defect of the Si substrate and the crack generated at that abnormally grown part taken from photographs in which the same reference numerals as in FIG. 6(a) designate the same parts. As shown in FIG. 7(a), it is found that crack 15 is generated through the pit 13 of the GaAs layer.

SUMMARY OF THE INVENTION

The present invention was made to solve those problems and it is an object of the present invention to provide a semiconductor structure having a semiconductor layer formed on an Si substrate, in which there is no abnormal growth when a GaAs layer is grown, a surface defect is reduced and there is no crack generated even when the thickness of the GaAs layer exceeds 5 microns.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a semiconductor structure of the present invention, thin films of AlAs and GaAs are formed between an Si substrate or Si layer and a semiconductor layer.

Since the thin films of AlAs and GaAs, whose total thickness is 700Å or less, are formed first on the Si substrate in the semiconductor structure before the semiconductor layer is formed in accordance with the present invention, there is no abnormal growth of the semiconductor layer on the surface and the surface defect is reduced. As a result, the yield of the semiconductor structure is improved and the generation of cracks is prevented.

BRIEF DESCRIPTION OF THE DRAWINGS

FIGS. 4(a–4(c) are views showing a conventional process for forming semiconductor layers on Si in a semiconductor structure;

FIGS. 7(a)–7(c) are views from photographs of crystals showing abnormal growth of GaAs layer formed on the Si crystal and crack generated at that abnormally grow part.

DETAILED DESCRIPTION OF PREFERRED EMBODIMENT

An embodiment of the present invention will be described in detail with reference to the drawings.

Figure 1A:
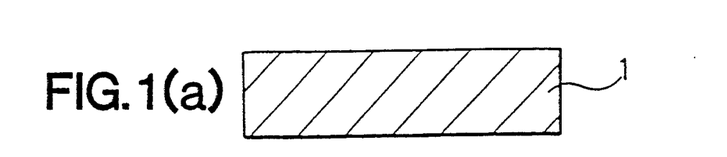
FIGS. 1(a)–1(c) are sectional views showing a process for forming semiconductor layers on Si in a semiconductor structure in accordance with an embodiment of the present invention.
Figure 1B:
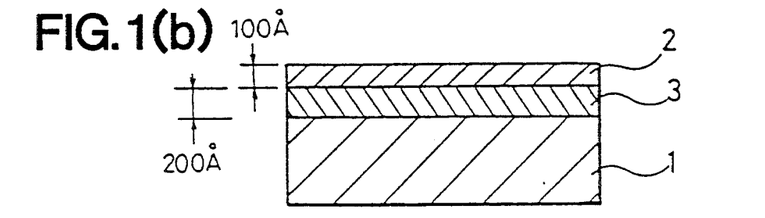
Figure 1C:
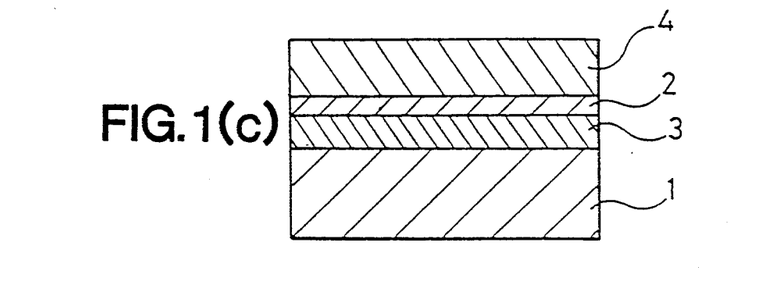

FIGS. 1(a)–1(c) are sectional views each showing a semiconductor structure at a manufacturing step in accordance with an embodiment of the present invention. In FIG. 1(a), reference numeral 1 designates an Si substrate having surface orientation which is off angle by several degrees from the (100) surface toward the <011> direction, reference numeral 2 designates a GaAs layer grown at low temperature, reference numeral 3 designates an AlAs layer grown at low temperature and reference numeral 4 designates a GaAs layer grown at high temperature.

Then, operation thereof will be described hereinafter.

First, a surface of the Si substrate 1 is cleaned in a hydrogen ($H_2$) atmosphere at 900° C. or more (FIG. 1(a)) and then the substrate 1 is cooled and then the AlAs layer 3 having a thickness of 200Å is formed thereon at approximately 400° C. by the MOCVD method. Then, the GaAs layer 2 having a thickness of 100Å is formed thereon the same condition as above (FIG. 1(b)).

Thereafter, the substrate 1 is heated up at 700° C. and the GaAs layer 4 having a thickness of 2 microns is formed by the MOCVD method (FIG. 1(c)).

As described in the conventional example, in the case where the GaAs layer is formed on different kinds of substrates, typical of the case where GaAs is formed on the Si substrate, the GaAs layer grown at low temperature (~400° C.) prevents generation of the surface orientation dependency crystal growth and three-dimensional crystal growth which occurs because of stress generated by the difference in the lattice constants. More specifically, since the crystal is grown in the state of chemical non-equilibrium equilibrium at low temperature, three-dimensional crystal growth is not likely to be generated, whereby a plane crystal can be easily obtained.

The reason why the AlAs layer 3 is grown first on the Si substrate 1 before the GaAs layer 2 is grown at low temperature is that the bonding force between AlAs and Si is greater than that between GaAs and Si, that is, the bonding force between an Al atom and an Si atom is greater than that between a Ga atom and the Si atom. Therefore, threedimensional crystal growth is not likely where the AlAs crystal is grown on the Si substrate as compared with a case where the GaAs crystal is grown and thus the surface of the Si crystal can be more flatly covered.

Figure 2:
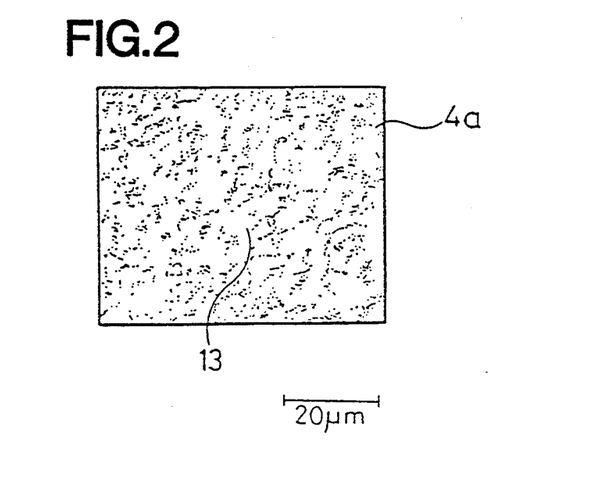
FIG. 2 is a view from a photograph showing a surface of a GaAs crystal formed on an Si crystal in a semiconductor device in accordance with an embodiment of the present invention.

FIG. 2 is a taken from a photograph showing the (100) surface of the GaAs layer 4 on the Si substrate. As shown in FIG. 2, there is a small pit 13 in the center thereof but there is no abnormal growth around the pit as is seen in FIG. 5.

As described above, since adhesion between the AlAs layer and the Si substrate is better than that between the GaAs layer and the Si substrate, the layer can be well flattened. Therefore, a surface defect can be reduced to a certain degree by changing the GaAs layer grown at low temperature by the conventional method to this AlAs layer, which will be described later. However, when the GaAs layer 4 is grown on the AlAs layer after the temperature thereof is increased to high temperature (~700° C.), a slight lattice mismatch exists (~0.2%) between the GaAs layer and the AlAs layer, with the result that abnormal growth is likely to occur because three-dimensional crystal growth is generated by stress which especially converges around the surface defect. Thus, in order to provide the GaAs layer 4 with less defects, it is necessary to use a homo-epitaxial growth step in which the AlAs layer 3 and the GaAs layer 2 are both grown at low temperature before the GaAs layer 4 is grown at high temperature. The GaAs layer 4 is grown on the GaAs layer 2 homo-epitaxially. Another reason for GaAs layer 2 is that AlAs is very sensitive to residual oxygen in the reactor and also apt to cause the surface defects during the high temperature GaAs growth. The surface defect of the GaAs layer 4 can be reduced by this method as compared with the case where the GaAs layer 4 is formed at high temperature on the AlAs layer 3 which has been grown on the Si substrate at low temperature.

In order to describe an effect of the present invention as compared with that in the conventional example, a semiconductor layer was grown on the Si substrate by the following three methods. The number of pits within an area of 3 inches of the wafer surface of each semiconductor layer was classified by a particle size thereof and counted. The results are shown in the following tables 1 to 3.

TABLE 1

[Conventional Example]
In case of GaAs buffer layer 2 (200 Å) + GaAs layer 4
(2 microns)

| Size of particle (μm²) | Number of pits |
|---|---|
| 0.48~1.44 | 1172 |
| 1.44~2.48 | 171 |
| 2.48~3.36 | 41 |
| 3.36~4.32 | 28 |
| 4.32~5.28 | 15 |
| 5.28~6.24 | 14 |
| 6.24~7.28 | 7 |
| 7.28~8.16 | 5 |
| 8.16~9.12 | 6 |
| 9.12~10.00 | 5 |
| more than 10.00 | 92 |
| The total number of pits | 1548 |

TABLE 2

In case of AlAs buffer layer 3 (200 Å) + GaAs layer 4
(2 microns)

| Size of particle (μm²) | Number of pits |
|---|---|
| 0.48~1.44 | 681 |
| 1.44~2.48 | 113 |
| 2.48~3.36 | 55 |
| 3.36~4.32 | 28 |
| 4.32~5.28 | 12 |
| 5.28~6.24 | 16 |
| 6.24~7.28 | 7 |
| 7.28~8.16 | 2 |
| 8.16~9.12 | 3 |
| 9.12~10.00 | 2 |
| more than 10.00 | 28 |
| The total number of pits | 931 |

TABLE 3

[The present embodiment]
In case of AlAs buffer layer 3 (200 Å) + GaAs buffer layer 2
(100 Å) + GaAs layer 4 (2 microns)

| Size of particle (μm²) | Number of pits |
|---|---|
| 0.48~1.44 | 445 |
| 1.44~2.48 | 18 |
| 2.48~3.36 | 9 |
| 3.36~4.32 | 8 |
| 4.32~5.28 | 5 |
| 5.28~6.24 | 3 |
| 6.24~7.28 | 4 |
| 7.28~8.16 | 4 |
| 8.16~9.12 | 3 |
| 9.12~10.00 | 3 |
| more than 10.00 | 68 |
| The total number of pits | 578 |

As can be seen from histograms of pits in the above tables 1 to 3, there are 1548 pits within 3 inches of the wafer in the prior art as shown in table 1, while the number of pits are considerably reduced to 571 because the AlAs layer is introduced in the present invention, which number is about one third as many as the above and also the size of the particles is reduced.

In addition, as shown in the table 2, the number of pits are 931 in the case where the GaAs layer 4 is formed on the Si substrate with only the AlAs layer 3 by hetero-epitaxial growth, which number is considerably larger than that in the case where the GaAs layer 4 is grown with the AlAs layer 3 and the GaAs layer 2. This is because of the mismatch of lattice constants of the GaAs layer 4 and the AlAs layer 2 as described above. Therefore, it is found that it is better to form the GaAs layer 4 by homo-epitaxial growth.

As described above, according to the present invention, since the AlAs layer 3 and the GaAs layer 2 are sequentially grown at low temperature until they are 700Å in thickness and then the GaAs layer 4 is formed at high temperature thereon, it is possible to prevent abnormal growth of the GaAs layer 4 caused by dust, a defect or the like on the Si substrate 1, with the result that when the thickness of the GaAs layer 4 is 5 microns or more, there is no crack generated. This is because the number of surface defects is considerably reduced and the size thereof is also reduced.

Although the AlAs layer 3 is 200Å in thickness and the GaAs layer 2 is 100Å in thickness in the above embodiment, thicknesses are not limited to these values and the same effect can be attained if each of these 50Å or more and the total thickness thereof is 700Å or less.

In addition, although the GaAs layer 4 is grown after the temperature is increased to 700° C. in the above embodiment, the material of the layer is not limited to GaAs and it may be another compound semiconductor such as AlGaAs, InP, InGaAs or InGaAsP. In case of InP or the like, it is also possible to start growth at a low temperature of approximately 400° C. after the temperature of the substrate 1 is increased to 700° C. and then decreased.

Figure 3A:
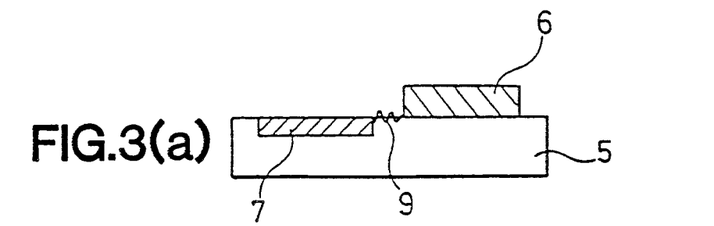
FIGS. 3(a)–3(c) are views showing an element formed on the Si crystal and an element formed on a compound semiconductor layer which are monolithic in accordance with an embodiment of the present invention.
Figure 3B:
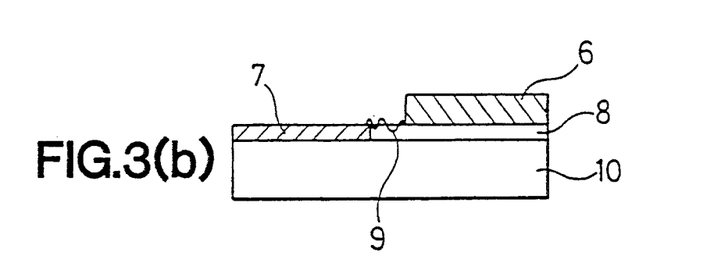
Figure 3C:
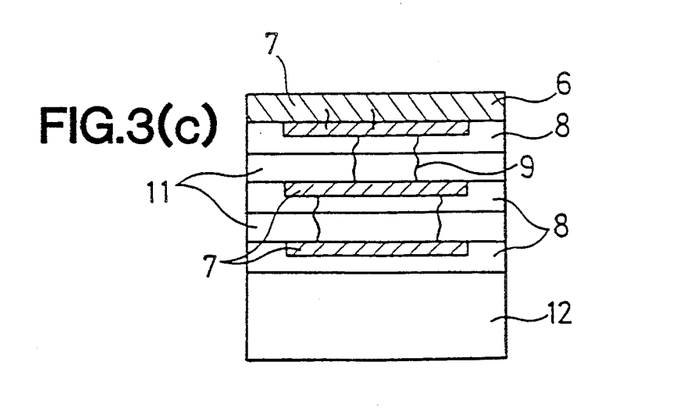

According to the present invention, a large scale integrated circuit (LSI) formed on the Si crystal is connected to an optical device and a microwave device formed on the GaAs or InP crystal with a wire and then a monolithic integrated circuit can be implemented. At this time, the Si crystal may be on an Si substrate or on an Si thin film on an insulating substrate such as sapphire. FIG. 3 (a) to 3(c) show several examples of structures in which that monolithic integrated circuit is implemented. In FIG. 3, reference numeral 5 designates an Si substrate, reference numeral 6 designates a GaAs group microwave IC or an InP group optical device reference numeral 7 designates a Si LSI, reference numeral 8 designates a thin film, reference numeral 9 designates a wire for connecting the IC 6 to the Si LSI 7, reference numeral 10 designates a sapphire substrate, reference numeral 11 designates an insulating film and reference numeral 12 designates a substrate formed of sapphire, Si or the like.

In FIG. 3(a), the LSI 7 is formed on the Si substrate 5 and the GaAs group microwave IC or InP group optical device 6 is formed on the GaAs layer formed on the Si substrate 5 and then the LSI 7 is connected to the microwave IC or the optical device 6 by the wire 9. In FIG. 3(b), the Si thin film 8 is formed on the sapphire substrate 10 instead of the Si substrate 5. In FIG. 3(c), a three-dimensional device such as Si—oxide film—Si is formed in such a manner that the Si thin film is formed on the substrate 12 formed of sapphire, Si or the like, the LSI 7 is formed on the Si thin film, the Si LSI 7 is formed thereon through the insulating film, which operation is repeated two times, the GaAs layer is formed on the Si film 8, the GaAs group microwave IC or InP group optical device 6 is formed therein and then the Si LSI 7 in each layer is connected to the GaAs group microwave IC or InP group optical device 6 by the wiring 9 provided in a through hole or the like.

Thus, when the LSI formed on the Si substrate and the optical device, microwave device or the like formed in the compound semiconductor layer on the Si substrate are made monolithic, there is no crack generated, with the result that the semiconductor device can be formed with high precision and yield and performance thereof can be improved.

According to the present invention, since the AlAs and the GaAs thin layers are formed between the Si substrate and the semiconductor layer, abnormal growth of the semiconductor layer generated by dust on the Si substrate or the like is prevented and the number of surface defects is considerably reduced. As a result, even when the thickness of the semiconductor layer is 5 microns or more, there is no crack generated therein, so that it is possible to provide a reliable semiconductor structure with high yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor structure comprising:
   a single crystal Si body;
   a single crystal AlAs layer disposed on said Si body;
   a single crystal first GaAs layer disposed on said AlAs layer wherein said AlAs and first GaAs layers are each at least 50 Å thick and the total of the thicknesses of said AlAs layer and said first GaAs layer does not exceed 700 Å; and
   a single crystal compound semiconductor layer at least 2 microns thick disposed on said first GaAs layer.

2. A semiconductor structure in accordance with claim 1 wherein compound semiconductor layer is a second GaAs layer.

3. A semiconductor structure in accordance with claim 2 wherein said AlAs layer is formed on said Si body at a first temperature, said first GaAs layer is formed on said AlAs layer at a temperature approximately the same as the first temperature, and said second GaAs layer is formed on said first GaAs layer at a second temperature higher than the first temperature.

4. A semiconductor structure in accordance with claim 3 wherein said AlAs layer and said first GaAs layer are formed at about 400° C. by the MOCVD method, and said second GaAs semiconductor layer is formed at about 700° C. by the MOCVD method.

5. A semiconductor structure in accordance with claim 2 wherein said AlAs layer is about 200Å in thickness, said firs GaAs layer is about 100Å in thickness, and said second GaAs layer is about 2 microns in thickness.

6. A semiconductor structure in accordance with claim 1 wherein said compound semiconductor layer is chosen from the group consisting of GaAs AlGaAs, InP, InGaAs, and InGaAsP.

7. A semiconductor structure in accordance with claim 1 wherein said Si body is disposed on a sapphire substrate.

8. A method of making a semiconductor structure including:
   growing a single crystal AlAs layer at least 50 Å thick on a single crystal silicon body;
   growing a first GaAs layer at least 50 Å thick on the AlAs layer, the total of the thicknesses of the AlAs layer and the first GaAs layer not exceeding 700 Å; and
   growing a single crystal compound semiconductor layer at least 2 microns thick on the first GaAs layer.

9. The method of claim 8 including growing the AlAs and first GaAs layers at approximately the same temperature and growing a second GaAs layer as the compound semiconductor layer at a temperature higher than the temperatures at which the AlAs layer and the first GaAs layer are grown.

10. The method of claim 9 including growing the AlAs and GaAs layers by the MOCVD method at about 400° C. and growing the second GaAs layer at abut 700° C. by the MOCVD method.

11. The method of claim 9 including growing the AlAs layer to about a 200Å thickness, the GaAs layer to about a 100Å thickness, and the second GaAs layer to about a 2 micron thickness.

* * * * *

UNITED STATES PATENT AND TRADEMARK OFFICE
CERTIFICATE OF CORRECTION

PATENT NO. : 5,136,347

DATED : August 4, 1992

INVENTOR(S) : Takashi Nishimura

It is certified that error appears in the above-identified patent and that said Letters Patent is hereby corrected as shown below:

Claim 2, column 7, line 30, after "wherein" insert --said--.

Claim 5, column 8, line 6, change "firs" to --first--.

Claim 6, column 8, line 10, after "GaAs" insert --,--.

Signed and Sealed this

Twenty-first Day of September, 1993

Attest:

BRUCE LEHMAN

*Attesting Officer*     *Commissioner of Patents and Trademarks*